United States Patent [19]

Jin et al.

[11] Patent Number: 5,045,249

[45] Date of Patent: Sep. 3, 1991

[54] ELECTRICAL INTERCONNECTION BY A COMPOSITE MEDIUM

[75] Inventors: Sungho Jin, Millington; John J. Mottine, Jr., West Keansburg; Robert L. Opila, Jr., Aberdeen; Richard C. Sherwood, New Providence; Thomas H. Tiefel, Piscataway, all of N.J.; William C. Vesperman, Bel Air, Md.

[73] Assignee: AT&T Bell Laboratories, Murray Hill, N.J.

[21] Appl. No.: 150,485

[22] Filed: Feb. 9, 1988

Related U.S. Application Data

[63] Continuation of Ser. No. 936,998, Dec. 4, 1986, abandoned, which is a continuation of Ser. No. 728,813, Apr. 30, 1985, abandoned.

[51] Int. Cl.$^5$ .............................................. H01R 9/09
[52] U.S. Cl. ...................................... 264/24; 264/108; 439/91; 439/591
[58] Field of Search ............. 339/17 M, 59 M, 61 M, 339/DIG. 3; 428/119, 120, 328, 329, 900, 901; 174/117 A; 264/24, 108, 162; 427/47, 48; 439/66, 74, 91, 591

[56] References Cited

U.S. PATENT DOCUMENTS

| | | | |
|---|---|---|---|
| 3,359,145 | 12/1967 | Salyer et al. | 156/331.4 |
| 3,539,671 | 11/1970 | Nauta | 264/162 |
| 3,648,002 | 3/1972 | DuRocher. | |
| 4,065,197 | 12/1977 | Kuist et al. . | |
| 4,113,981 | 9/1978 | Fujita et al. | 174/188 R |
| 4,118,102 | 10/1978 | Kuist et al. . | |
| 4,209,481 | 1/1980 | Kashiro et al. | 264/24 |
| 4,425,400 | 1/1984 | Yamaguchi et al. | 428/329 |
| 4,449,774 | 5/1984 | Takashi et al. | 439/91 |
| 4,546,037 | 10/1985 | King | 428/328 |
| 4,548,862 | 10/1985 | Hartman | 174/117 A |
| 4,552,713 | 11/1985 | Cavicchioli | 264/162 |

OTHER PUBLICATIONS

Electronic Connector Study Group Inc. Seventh Annual Connector Symposium Proceedings, 1974, C. H. Kuist, pp. 204–210.
Japanese Patent Application Publication 58-152033, published Sep. 9, 1963, K. Arai et al.
Japanese Patent Application Publication 55-159578, published May 30, 1979, K. Arai et al.

Primary Examiner—Neil Abrams
Attorney, Agent, or Firm—B. S. Schneider

[57] ABSTRACT

Electrical interconnections are made by means of a layer or sheet medium comprising chains of magnetically aligned, electrically conducting particles in a nonconducting matrix material. End particles of chains protrude from a surface of the medium, thereby enhancing electrical contact properties of the medium. The medium can be used for temporary as well as permanent connections; in the latter case the use of a nonconductive adhesive material is convenient for physical attachment to contacts on both sides of the medium.

6 Claims, 1 Drawing Sheet

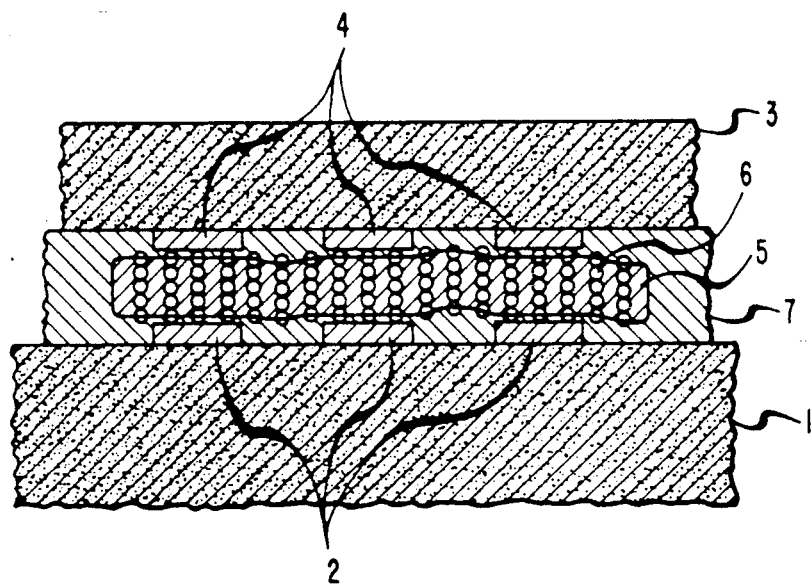

ELECTRICAL INTERCONNECTION BY A COMPOSITE MEDIUM

This is a continuation of application Ser. No. 936,998, filed Dec. 4, 1986, now abandoned, which was a continuation of application Ser. No. 728,813, filed Apr. 30, 1985, now abandoned.

TECHNICAL FIELD

The invention is concerned with electrical connections and, more particularly, with the use of composite materials for making such connections.

BACKGROUND OF THE INVENTION

While soldering in many instances is a satisfactory method of making electrical connections, alternatives have been proposed as motivated, e.g., by a desire to simplify large-scale commercial practice. For example, U.S. Pat. No. 4,065,197, issued Dec. 27, 1977 to C. H. Kuist et al., U.S. Pat. No. 4,118,102, issued Oct. 3, 1978 to C. H. Kuist et al., and the paper by C. H. Kuist, *Anisotropic Conduction in Elastomeric Composites*, Electronic Connector Study Group Inc., Seventh Annual Connector Symposium Proceedings, 1974, pp. 204–210 disclose an electrical connector in sheet form which is made from a mixture of flexible insulator material and metal particles, the sheet having relatively low electrical resistance between closely spaced points which typically are on opposing surfaces, and the sheet having relatively high resistance between any two points spaced beyond a critical isolation distance.

Common to the cited references is randomization of conductive particles in a nonconductive matrix material, this in contrast to alignment of such particles as disclosed in Japanese Patent Application Publication 55-152033, "Anisotropically Conductive Rubber Sheet", published Sept. 9, 1983 by K. Arai et al. and Japanese Patent Application Publication 55-159578, "Connector", published May 30, 1979 by K. Arai et al.

SUMMARY OF THE INVENTION

Electrically conductive, magnetic particles are aligned in an essentially nonconductive matrix material upon application of a magnetic field, contact properties of a resulting interconnection medium being enhanced by end particles of particle chains protruding from the surface of the matrix material on at least one side of the medium and at least in the absence of compression. The resulting electrical interconnection medium may be used for temporary connections or it may be used to permanently interconnect device components. In either case, clamps may be used to fix an assembly; for permanent connections the use of an adhesive may be preferred.

BRIEF DESCRIPTION OF THE DRAWING

Shown schematically and in cross section is a device in accordance with the invention.

DETAILED DESCRIPTION

The FIGURE shows a device component 1 with electrical contact pads 2, a device component 3 with electrical contact pads 4 which are opposite and aligned with contact pads 2, nonconductive matrix material of an electrical connection medium 5 comprising aligned conductive particles 6, and adhesive 7. In specific embodiments component 1 may be, e.g., a circuit board (flexible or rigid) or a silicon substrate, and component 3 may be a packaged or unpackaged silicon integrated circuit chip or chip carrier.

As shown in the FIGURE, adhesive 7 provides for adhesion between medium 5 and contacts 2 and 4 as well as at points in between and apart from electrical connection points. Alternatively, use of an adhesive may be akin to clamping by adhesive spots or strips directly between parts 1 and 3 at points other than points of contact and where no connection medium 5 is interposed. In this case, hardening of the adhesive under compression leads to residual stress in the adhesive, holding the connection medium 5 under compression even after release of external pressure.

Electrically conductive, magnetic particles 6 are aligned into essentially straight chains as resulting from application of a magnetic field in the z-direction of desired conductivity transverse to the x-y plane of the interconnection medium, and end particles of chains protrude from a free surface on at least one side of the interconnection medium. For particles to protrude from one surface only, manufacture of the interconnection medium conveniently involves magnetic field alignment of a layer which is supported from below and which has a free upper surface. In the interest of particles protruding a desired amount, magnetic field strength is chosen in view of parameters such as, e.g., thickness and viscosity of the interconnection medium. (Too strong a field may result in the formation of dendrite structure and excessive protrusion; too weak a field may produce chains too short for conduction in the z-direction.)

An interconnection medium having particles protruding at both surfaces can be made by first coating a substrate with an easily penetrable, removable substance such as, e.g., grease or honey, further depositing a layer of the composite material, applying a magnetic field, curing, peeling off the cured composite medium, and removing of the coating substance, e.g., by application of a suitable solvent.

As an alternative to the use of a solvent-removable substance such as, e.g., grease or honey, non-adhering substances such as, e.g., rubber or wax may be used to support the medium during magnetic field alignment and curing. Additionally, and in the interest of more positive control of upper surface flatness, a substrate having an easily penetrable, soft coating may be placed on top of a connection medium during curing.

Particles typically are made to protrude from the surface by approximately one-tenth to one-half of particle diameter, and particles are made from a magnetic material such as, e.g., iron, nickel, cobalt, an alloy comprising iron, nickel, or cobalt, or a ferrite material, possibly coated with a protective material such as, e.g., silver, gold, or an alloy comprising silver or gold. Particles may be spherical or nonspherical, and typical particle diameters are in the range of from 0.1 to 500 micrometers and preferably in the range of from 1 to 200 micrometers.

Magnetic field strengths suitable for particle alignment depend on layer thickness, greater field strength being advantageous for thinner layers. Typical field strengths are in a range of from 100 to 2000 oersteds and more typically in a range of from 300 to 800 oersteds.

Nonconductive matrix materials may have elastomeric, adhesive, or glassy properties; among suitable materials are polymeric materials such as, e.g., rubber, silicone, epoxies and other resins. Curing of silicone and thermosetting resins may be by heating in a furnace or by inductive or microwave means; alternatively, light-sensitive resins may be cured upon exposure to optical radiation which may be visible, infrared, or ultraviolet.

Conductor pads used with the interconnection medium typically have a size in the range of from 1 to 200 mils, sizes less than 100 mils being preferred. Spacing of pads typically is about the same as pad size.

The following benefits and advantages are emphasized with respect to various aspects of the invention:

(i) Conductivity and reliability are enhanced due to protruding, exposed portions of conductive particles.

(ii) Manufacture of an interconnection medium is simplified in the absence of a top surface cover.

(iii) Also in the absence of a top surface cover, entrapment of air bubbles in the medium is minimized.

(iv) Minimized also in the absence of a top surface cover is the formation of conductive particle bridges between aligned columns as such bridges tend to form primarily at interior surfaces of bubbles trapped between columns.

(v) Use of non-conductive adhesive layers in combination with an anisotropically conductive interconnection sheet medium of the invention facilitates permanent interconnection and obviates the need for a magnetic field during device assembly.

The following examples illustrate manufacture of the interconnection medium and its electrical properties.

EXAMPLE 1

Urethane flexible adhesive designated as Hardman Kalex No. 15036 was mixed with 5 volume percent gold-coated nickel spheres having a diameter of 1 mil, the gold coating having a thickness of approximately 1200 Angstroms. A glass plate was coated with a 0.5-mil-thick layer of grease, and a 4-mil-thick layer of the mixture of adhesive and metal spheres was placed on top of the layer of grease. The free surface of the mixture was left uncovered, and a magnetic field having a strength of approximately 1000 oersteds was applied in a direction perpendicular to the layer while the adhesive cured. The cured interconnection medium was peeled off the glass base and degreased in trichloroethane.

Contact resistance of the medium was measured with a 4-point probe having pads of dimensions 50 mils by 25 mils, spaced 45 mils apart. A series of measurements showed contact resistance to be in the range from 150 to 300 milliohms, and isolation resistance was determined to be greater than $20 \times 10^6$ ohms.

EXAMPLE 2

A silicone resin material known as RTV 615 was mixed with 10 volume percent gold-coated nickel spheres having a diameter of approximately 2 mils. The mixture was spread on a flat glass substrate to form a layer having a thickness of approximately 10 mils, and the layer was cured in a magnetic field having a strength of 400 oersteds while the top surface of the layer was free. Curing was in an oven at a temperature of approximately 100 degrees C. for a duration of approximately 10 minutes.

A 4-point probe was used for resistance measurement at a pressure of approximately 9 psi; 50 measurements were taken by varying the position of the probe, and resistance values were obtained in the range of from 21 to 69 milliohms, averaging approximately 33 milliohms. (Such resistance values may be compared with values in the range of from 22 to 203 milliohms and averaging approximately 71 milliohms as obtained with a prior-art medium made to have non-protruding particles. Preparation of such prior-art comparison medium involved use of a glass covering substrate during curing of a layer which otherwise was made as described above.)

EXAMPLE 3

A layer of grease having a thickness of 2 to 3 mils was spread on a glass substrate. The mixture of Example 2 above was spread over the layer of grease, and curing was as in Example 2 above. The cured interconnection medium was peeled off and the adhering grease was dissolved in trichloroethane. Contact resistance was in the range of from 10 to 29 milliohms, averaging approximately 19 milliohms.

What is claimed is:

1. A method for making an electrical interconnection medium, said method comprising exposing a layer of a composite material to a magnetic field, said composite material comprising magnetic, electrically conductive, essentially spherical particles in a nonconductive matrix material, said magnetic field having a direction which is essentially perpendicular to said layer, said magnetic field being applied for a period during which said matrix material undergoes at least partial hardening and while at least one surface of said layer is essentially unconstrained, whereby, during said period, magnetic particles are aligned into mutually isolated chains essentially perpendicular to said layer and such that end particles of chains protrude from said matrix material at said at least one layer surface.

2. The method of claim 1 in which the strength of said magnetic field is chosen such that end particles protrude from said at least one layer surface by one-tenth to one-half particle diameter.

3. The method of claim 1 in which both surfaces of said layer are essentially unconstrained.

4. The method of claim 1 in which said end particles protrude into air.

5. The method of claim 1 in which said end particles protrude into an easily penetrable material.

6. The method of claim 5 in which said easily penetrable material is grease or honey.

* * * * *